United States Patent
Zhang et al.

(10) Patent No.: US 9,859,882 B2
(45) Date of Patent: *Jan. 2, 2018

(54) HIGH VOLTAGE COMPOSITE SEMICONDUCTOR DEVICE WITH PROTECTION FOR A LOW VOLTAGE DEVICE

(75) Inventors: Jason Zhang, Monterey Park, CA (US); Tony Bramian, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/416,252

(22) Filed: Mar. 9, 2012

(65) Prior Publication Data
US 2012/0241756 A1    Sep. 27, 2012

Related U.S. Application Data

(60) Provisional application No. 61/454,743, filed on Mar. 21, 2011.

(51) Int. Cl.
*H03K 17/081* (2006.01)
*H03K 17/10* (2006.01)
*H03K 17/567* (2006.01)

(52) U.S. Cl.
CPC ..... *H03K 17/08116* (2013.01); *H03K 17/107* (2013.01); *H03K 17/567* (2013.01)

(58) Field of Classification Search
CPC .. H03K 17/107; H03K 17/168; H03K 17/567; H03K 17/30; H03K 2017/6875; H01L 27/06; H01L 27/088; H01L 27/095
(Continued)

(56) References Cited

U.S. PATENT DOCUMENTS

| 4,663,547 A | 5/1987 | Baliga |
| 5,142,239 A | 8/1992 | Brayton |

(Continued)

FOREIGN PATENT DOCUMENTS

| EP | 2 242 103 | 10/2010 |
| JP | 3-196572 | 8/1991 |

(Continued)

OTHER PUBLICATIONS

U.S. Appl. No. 61/448,617, filed Mar. 2, 2011, Lin.

(Continued)

*Primary Examiner* — Fernando L. Toledo
*Assistant Examiner* — Lawrence-Linh T Nguyen
(74) *Attorney, Agent, or Firm* — Murphy, Bilak & Homiller, PLLC

(57) ABSTRACT

There are disclosed herein various implementations of composite semiconductor devices including a voltage protected device. In one exemplary implementation, a normally OFF composite semiconductor device comprises a normally ON III-nitride power transistor having a first output capacitance, and a low voltage (LV) device cascoded with the normally ON III-nitride power transistor to form the normally OFF composite semiconductor device, the LV device having a second output capacitance. A ratio of the first output capacitance to the second output capacitance is set based on a ratio of a drain voltage of the normally ON III-nitride power transistor to a breakdown voltage of the LV device so as to provide voltage protection for the LV device.

16 Claims, 4 Drawing Sheets

(58) Field of Classification Search
USPC ... 257/46, 76, 104, 109, 112, 175, 195, 199, 257/392, E27.16, E29.89; 323/222
See application file for complete search history.

(56) References Cited

U.S. PATENT DOCUMENTS

| | | |
|---|---|---|
| 5,939,753 A | 8/1999 | Ma |
| 6,316,809 B1 | 11/2001 | Eshraghi |
| 7,291,872 B2 | 11/2007 | Hikita |
| 7,501,670 B2 | 3/2009 | Murphy |
| 7,719,055 B1 | 5/2010 | McNutt |
| 7,777,254 B2 | 8/2010 | Sato |
| 7,915,645 B2 | 3/2011 | Briere |
| 8,084,783 B2 | 12/2011 | Zhang |
| 8,368,120 B2 | 2/2013 | Lidow |
| 8,766,375 B2 | 7/2014 | Bramian |
| 2001/0024138 A1 | 9/2001 | Dohnke |
| 2002/0153938 A1 | 10/2002 | Baudelot |
| 2003/0011436 A1 | 1/2003 | Shigematsu |
| 2003/0137037 A1 | 7/2003 | Omura |
| 2004/0184216 A1* | 9/2004 | Kurosawa ............ H01L 27/0811 361/277 |
| 2005/0007200 A1 | 1/2005 | Inoue |
| 2006/0060895 A1 | 3/2006 | Hikita |
| 2006/0113593 A1 | 6/2006 | Sankin |
| 2006/0175627 A1 | 8/2006 | Shiraishi |
| 2007/0046379 A1 | 3/2007 | Tanahashi |
| 2007/0170897 A1 | 7/2007 | Williams |
| 2007/0210333 A1 | 9/2007 | Lidow |
| 2007/0215899 A1* | 9/2007 | Herman ..................... 257/147 |
| 2007/0228401 A1 | 10/2007 | Machida |
| 2008/0191216 A1* | 8/2008 | Machida et al. ................. 257/76 |
| 2008/0230784 A1* | 9/2008 | Murphy ........................ 257/76 |
| 2009/0135636 A1 | 5/2009 | Kuzumaki |
| 2010/0224885 A1 | 9/2010 | Onose |
| 2010/0301396 A1* | 12/2010 | Briere ................ H01L 21/8221 257/195 |
| 2011/0018625 A1 | 1/2011 | Hodel |
| 2011/0140169 A1 | 6/2011 | Briere |
| 2011/0169550 A1 | 7/2011 | Brindle |
| 2011/0210337 A1 | 9/2011 | Briere |
| 2011/0210338 A1 | 9/2011 | Briere |
| 2012/0105131 A1 | 5/2012 | Biela |
| 2013/0062671 A1 | 3/2013 | Saito |

FOREIGN PATENT DOCUMENTS

| | | |
|---|---|---|
| JP | H 3-196572 | 8/1991 |
| JP | 8-308092 | 11/1996 |
| JP | 2006-351691 | 12/2006 |
| JP | 2008-243943 | 10/2008 |
| JP | 2009-38130 | 2/2009 |
| JP | 2010-94006 | 4/2010 |
| JP | 2010-522432 | 7/2010 |
| JP | 2010-278280 | 12/2010 |
| JP | 2010-283346 | 12/2010 |
| JP | 2011-29386 | 2/2011 |
| WO | WO 2008/116038 | 9/2008 |

OTHER PUBLICATIONS

U.S. Appl. No. 61/448,347, filed Mar. 2, 2011, Lin.
U.S. Appl. No. 61/339,190, filed Mar. 1, 2010, Briere.
Ashot Melkonyan, "High Efficiency Power Supply using new SiC devices", 2007, Kassel University Press GmbH, pp. 1-3, 105-106.
U.S. Appl. No. 61/454,081, filed Mar. 18, 2011, Briere.
U.S. Appl. No. 61/454,743, filed Mar. 21, 2011, Zhang.
U.S. Appl. No. 13/415,779, filed Mar. 8, 2012, Zhang.
U.S. Appl. No. 13/419,820, filed Mar. 14, 2012, Briere.
U.S. Appl. No. 13/417,143, filed Mar. 9, 2012, Bramian.
U.S. Appl. No. 14/318,458, filed Jun. 27, 2014, Bramian.

* cited by examiner

HIGH VOLTAGE COMPOSITE SEMICONDUCTOR DEVICE WITH PROTECTION FOR A LOW VOLTAGE DEVICE

The present application claims the benefit of and priority to a provisional application entitled "III-Nitride Optimized Rugged Cascode Power Device," Ser. No. 61/454,743 filed on Mar. 21, 2011. The disclosure in this provisional application is hereby incorporated fully by reference into the present application.

BACKGROUND

I. Definitions

As used herein, the phrase "III-nitride" or "III-N" refers to a compound semiconductor that includes nitrogen and at least one group III element including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-nitride also refers generally to any polarity including but not limited to Ga-polar, N-polar, semi-polar or non-polar crystal orientations. A III-nitride material may also include either the Wurtzitic, Zincblende or mixed polytypes, and may include single-crystal, monocrystal, polycrystal, or amorphous crystal structures.

Also, as used herein, the terms "LV-device," "low voltage semiconductor device," "low voltage transistor," and the like, refer to a low voltage device, with a typical voltage range of up to approximately 50 volts. Typical voltage ratings include low voltage (LV)~0-50V, midvoltage (MV) ~50-200V, high voltage (HV)~200-1200V and ultra high voltage (UHV)~>1200V. The device can comprise any suitable semiconductor material that forms a field-effect transistor (FET) or diode, or a combination of a FET and a diode. Suitable semiconductor materials include group IV semiconductor materials such as silicon, strained silicon, SiGe, SiC, and group III-V materials including III-As, III-P, III-nitride or any of their alloys.

II. Background Art

III-nitride materials are semiconductor compounds that have a relatively wide, direct bandgap and potentially strong piezoelectric polarizations, and can enable high breakdown fields, high saturation velocities, and the creation of two-dimensional electron gases (2-DEGs). As a result, III-nitride materials are used in many power applications such as depletion mode (e.g., normally ON) power field-effect transistors (FETs), high electron mobility transistors (HEMTs), and diodes.

In power management applications where normally OFF characteristics of power devices are desirable, a depletion mode III-nitride device can be cascoded with a low voltage (LV) semiconductor device to produce an enhancement mode composite power device. However, the utility and durability of such a composite device can be limited according to the characteristics of the LV semiconductor device included therein. For example, the durability of the composite device may be limited by the breakdown voltage of the LV semiconductor device. In order to render such composite devices suitable for operation in power management systems, where high voltage spikes may be present, the composite device should be configured to provide voltage protection for the LV device.

SUMMARY

The present disclosure is directed to a high voltage composite semiconductor device with protection for a low voltage device, substantially as shown in and/or described in connection with at least one of the figures, and as set forth more completely in the claims.

DETAILED DESCRIPTION

Figure 1:
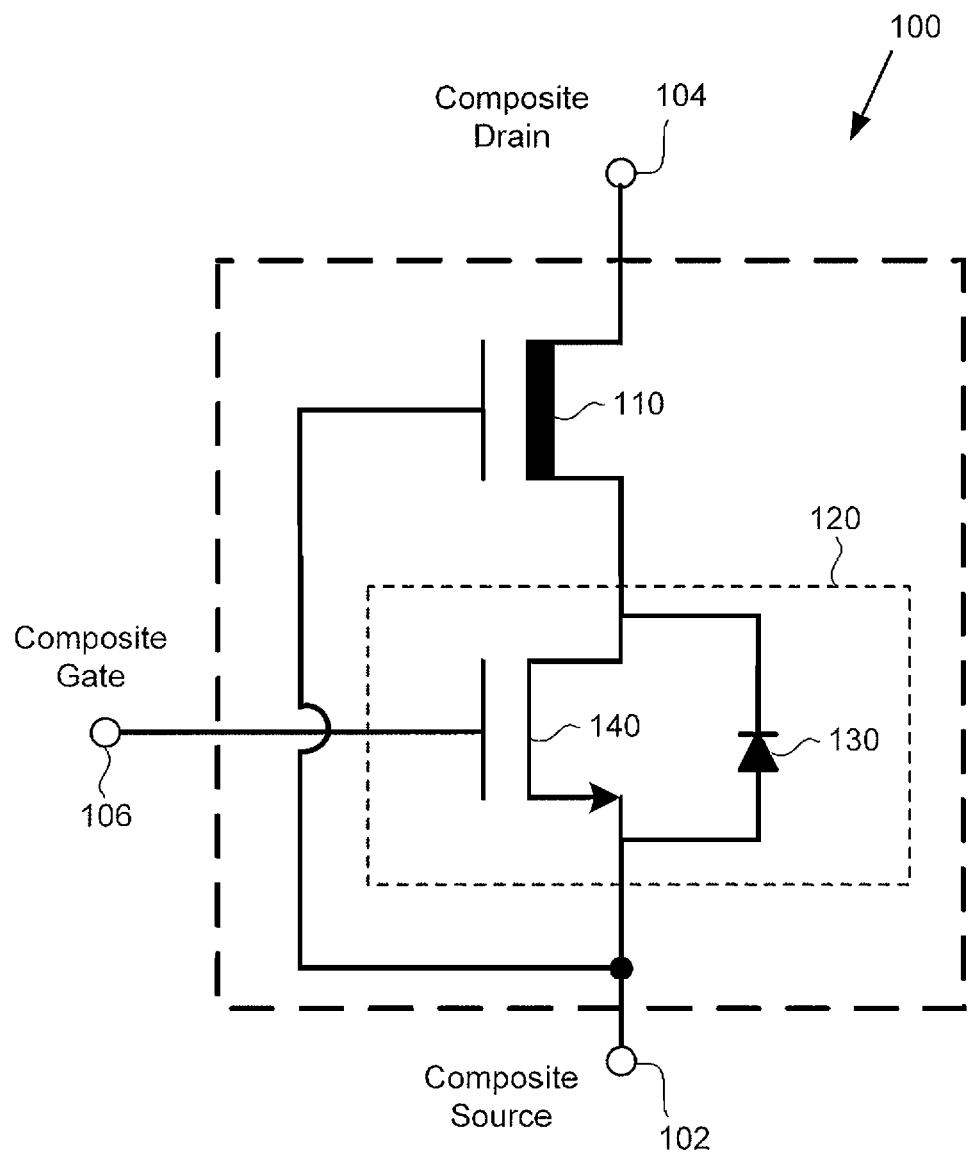
FIG. 1 presents a diagram showing one exemplary implementation of a composite semiconductor device including a voltage protected device.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

III-nitride materials include, for example, gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap and strong piezoelectric polarizations, and can enable high breakdown fields, high saturation velocities, and the creation of two-dimensional electron gases (2-DEGs). As a result, and as noted above, III-nitride materials such as GaN are used in many microelectronic applications such as depletion mode (e.g., normally ON) power field-effect transistors (FETs), high electron mobility transistors (HEMTs), and diodes.

As further noted above, in power management applications where normally OFF characteristics of power devices are required, a depletion mode III-nitride device can be cascoded with a low voltage (LV) semiconductor device to produce an enhancement mode composite power device. However, the utility and durability of such a composite device can be limited according to the characteristics of the LV semiconductor device cascoded with the normally ON III-nitride power device. For example, the durability of the composite device may be limited by the breakdown voltage of the LV semiconductor device. In order to render such composite devices suitable for operation in power management systems, where high voltage spikes may be present, the composite device should be configured to provide voltage protection for the LV device.

Moreover, in order to make a practical composite device suitable for operation in power management systems, the composite device should be designed to provide many years of reliable operation, such as ten years or more. However, to achieve such a result, the cascade device configuration may require optimization with respect to the sizes of the devices involved, as well as device characteristics such as breakdown voltages and output capacitances, for example.

The present application is directed to a composite semiconductor device including a voltage protected device, such as an LV group IV semiconductor device formed of silicon, for example. According to one implementation, the composite semiconductor device may include a III-nitride power transistor having a first output capacitance, and an LV device having a second output capacitance cascoded with the III-nitride power transistor. The cascoded combination of the LV device with the III-nitride power transistor, which may be a normally ON device, for example, can be implemented to produce a normally OFF composite device. As disclosed herein, the composite semiconductor device may be configured such that the ratio of the first output capacitance to the second output capacitance is set based on a ratio of a drain voltage of the III-nitride power transistor to a breakdown voltage of the LV device so as to provide voltage protection for the LV device.

Referring to FIG. 1, FIG. 1 shows one exemplary implementation of a composite semiconductor device including a voltage protected device. As shown in FIG. 1, composite semiconductor device 100 includes III-nitride power transistor 110 and LV device 120 cascoded with III-nitride power transistor 110. As further shown in FIG. 1, LV device 120 includes LV transistor 140 and LV diode 130. Also shown in FIG. 1 are composite source 102, composite drain 104, and composite gate 106 of composite semiconductor device 100.

III-nitride power transistor 110 may be formed of gallium nitride (GaN), and may be implemented as an insulated-gate FET (IGFET) or as a heterostructure FET (HFET), for example. In one implementation, III-nitride power transistor 110 may take the form of a metal-insulator-semiconductor FET (MISFET or MISHFET)), such as a metal-oxide-semiconductor FET (MOSFET). Alternatively, when implemented as an HFET, III-nitride power transistor 110 may be a HEMT configured to produce a 2-DEG. According to one implementation, for example, III-nitride power transistor 110, for example a III-nitride field-effect transistor FET) or a III-nitride high electron mobility transistor (III-N HEMT), may be a high voltage (HV) device configured to sustain a drain voltage of approximately 600V and having a gate rating of approximately 40V. It is noted that in some implementations, composite semiconductor device 100 may utilize an insulated gate bipolar transistor (IGBT) as a power device in place of a III-nitride FET or HEMT.

LV device 120 is shown to include LV transistor 140 and LV diode 130. In one implementation, LV diode 130 may simply be a body diode of LV transistor 140, while in another implementation LV diode 130 may be a discrete diode coupled to LV transistor 140 as shown in FIG. 1 to produce LV device 120. LV device 120 may be implemented as an LV group IV device, such as a silicon device having a breakdown voltage of approximately 25V, for example.

According to one implementation, LV device 120 may be a silicon MISFET or MOSFET, for example, including LV body diode 130.

The cascoded combination of III-nitride power transistor 110 and LV device 120 produces composite semiconductor device 100, which according to the implementation shown in FIG. 1 results in a composite three terminal device functioning in effect as a FET having composite source 102 and composite gate 106 provided by LV device 120, and composite drain 104 provided by III-nitride power transistor 110. Moreover, and as will be described in greater detail below, composite semiconductor device 100 may be implemented as an HV composite device configured to provide voltage protection for LV device 120.

Figure 2:
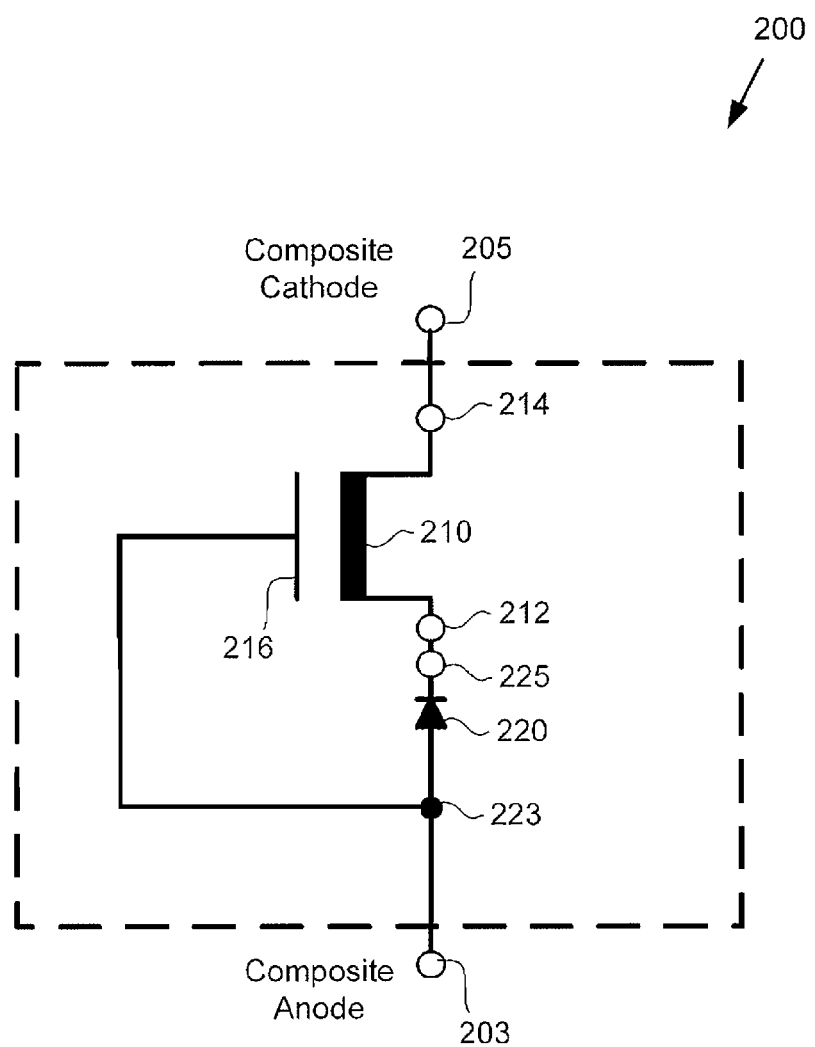
FIG. 2 presents a diagram showing another exemplary implementation of a composite semiconductor device including a voltage protected device.

Referring now to FIG. 2, FIG. 2 shows another exemplary implementation of a composite semiconductor device including a voltage protected device. As shown in FIG. 2, composite semiconductor device 200 includes III-nitride power transistor 210 and LV device 220 cascoded with III-nitride power transistor 210. III-nitride power transistor 210 is shown to include source 212, drain 214, and gate 216. III-nitride power transistor 210, which can be for example a III-nitride field-effect transistor (III-N FET) or a III-nitride high electron mobility transistor (III-N HEMT), corresponds to III-nitride power transistor 110, in FIG. 1, and may share any of the features previously attributed to III-nitride power transistor 110, above. Also shown in FIG. 2 are composite anode 203 and composite cathode 205 of composite semiconductor device 200.

According to the implementation shown by FIG. 2, LV device 220 is an LV diode including anode 223 and cathode 225, and may be implemented as an LV group IV diode such as a silicon diode, for example. LV device 220 is cascoded with III-nitride power transistor 210 to produce composite semiconductor device 200. That is to say, cathode 225 of LV device 220 is coupled to source 212 of III-nitride power transistor 210, anode 223 of LV device 220 provides composite anode 203 for composite semiconductor device 200, drain 214 of III-nitride power transistor 210 provides composite cathode 205 for composite semiconductor device 200, and gate 216 of III-nitride power transistor 210 is coupled to anode 223 of LV device 220.

The cascoded combination of III-nitride power transistor 210 and LV device 220 produces composite semiconductor device 200, which according to the implementation shown in FIG. 2 results in a composite two terminal device functioning in effect as a diode having composite anode 203 provided by LV device 220, and composite cathode 205 provided by III-nitride power transistor 210. Moreover, and as will be described in greater detail below, composite semiconductor device 200 may be implemented as an HV composite device configured to provide voltage protection for LV device 220.

Figure 3:
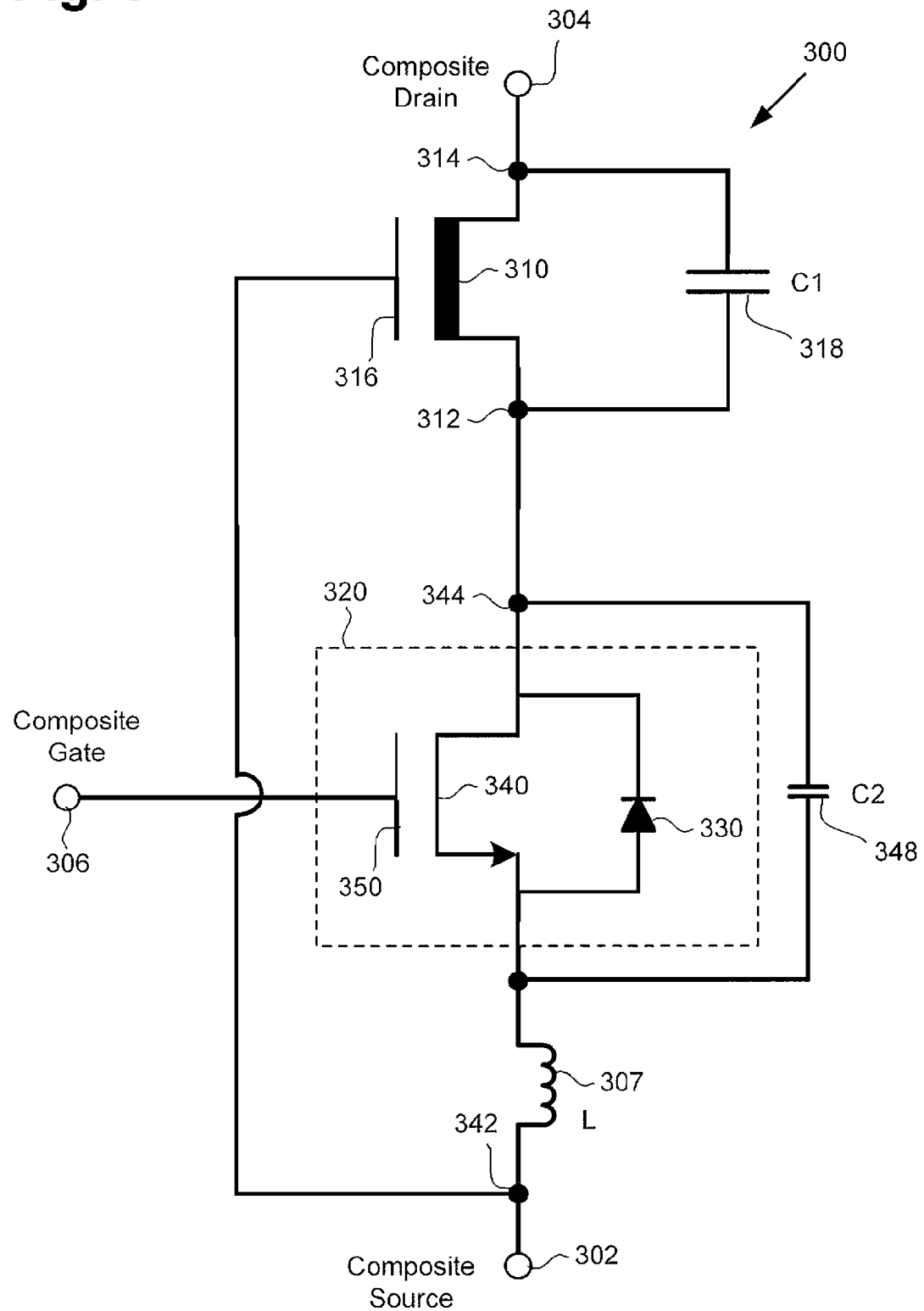
FIG. 3 shows a more detailed representation of a composite semiconductor device including a voltage protected device, corresponding to the implementation shown by FIG. 1.

Continuing to FIG. 3, FIG. 3 shows a more detailed representation of a composite semiconductor device including a voltage protected device, corresponding to the implementation shown by FIG. 1. Composite semiconductor device 300 includes III-nitride power transistor 310 and LV device 320 cascoded with III-nitride power transistor 310 which can be for example a III-nitride field-effect transistor (III-N FET) or a III-nitride high electron mobility transistor (III-N HEMT). As further shown in FIG. 3, LV device 320 includes LV transistor 340 and LV diode 330, which may be a body diode of LV transistor 340, for example. Also shown in FIG. 3 are composite source 302, composite drain 304, and composite gate 306 of composite semiconductor device 300, as well as first output capacitance 318 (C1) measured across III-nitride power transistor 310, second output capacitance 348 (C2) measured across LV device 320 (e.g., LV transistor 340 having LV body diode 330), and inductance 307.

Composite semiconductor device 300 having composite source 302, composite drain 304, composite gate 306, and formed from III-nitride power transistor 310 in combination with LV device 320 including LV transistor 340 and LV diode 330 corresponds to composite semiconductor device 100 having composite source 102, composite drain 104, composite gate 106, and formed from III-nitride power transistor 110 in combination with LV device 120 including LV transistor 140 and LV diode 130, in FIG. 1, and may share any of the characteristics previously attributed to those corresponding features, above.

As shown in FIG. 3, LV transistor 340 is cascoded with III-nitride power transistor 310 to produce composite semiconductor device 300. That is to say, drain 344 of LV transistor 340 is coupled to source 312 of III-nitride power transistor 310, source 342 of LV transistor provides composite source 302 for composite semiconductor device 300, and gate 350 of LV transistor 340 provides composite gate 306 for composite semiconductor device 300. Moreover, drain 314 of III-nitride power transistor 310 provides composite drain 304 for composite semiconductor device 300, while gate 316 of III-nitride power transistor 310 is coupled to source 342 of LV transistor 340.

The operation of composite semiconductor device 300 implemented as a normally OFF device formed from LV transistor 340 cascoded with normally ON III-nitride power transistor 310 will now be described by reference to specific, but merely exemplary, parameters. For example, as voltage is increased at composite drain 304 of composite semiconductor device 300 while III-nitride power transistor 310 is ON, a few volts (e.g., approximately 10V) will develop across reverse biased LV diode 330. This voltage is inverted and applied to gate 316 of III-nitride power transistor 310 (e.g., as an approximately −10V gate voltage). In response, III-nitride power transistor 310 will turn OFF (e.g., assuming a pinch voltage of approximately −7V) and any additional increase in the drain voltage at composite drain 304 will be sustained across drain 314 and source 312 of III-nitride power transistor 310. Consequently, LV transistor 340 and LV diode 330 will typically not be required to sustain a voltage beyond the first few volts (e.g., approximately 10V).

However, in order to provide effective voltage protection for LV transistor 340 and LV diode 330, it is important to more reliably establish that the voltage at drain 344 of LV transistor 340 will not rise beyond the rated breakdown voltage of LV device 320 (e.g., approximately 25V). In one implementation, it may be advantageous to optimize the pinch-off voltage of III-nitride power transistor 310 in accord with a breakdown voltage rating of gate 316. In other words, the pinch off voltage may be designed such that III-nitride power transistor 310 turns OFF before the voltage rating of gate 316 is exceeded. For example a pinch-off voltage of approximately −7V ensures that the III-nitride power transistor 310 turns OFF, while not exceeding the voltage rating of gate 316 (e.g., approximately 40V) and also not exceeding the breakdown voltage of LV transistor 340 (e.g., approximately 25V). It is noted that the described optimization applies to direct-current (DC) operating conditions. Alternatively, or in addition, LV transistor 340 may be configured to have repetitive avalanche capability so as to be capable of entering into the avalanche region on every cycle while continuing to function reliably.

The voltage at drain 344 of LV transistor 340 can also be affected by reverse leakage current of LV diode 330. As a result, LV diode 330 may need to be designed such that its reverse leakage current does not exceed certain values over various ranges of temperature and operational voltages. Consequently, in certain implementations, it may be preferred to utilize a MOS type silicon diode, for example, rather than a Schottky diode which may tend to exhibit greater leakage at elevated temperatures. LV diode 330 is typically an integrated part of the die on which LV transistor 340 is fabricated, and the area devoted to LV diode 330 can contribute to the reverse leakage current.

Additionally, when composite semiconductor device 100 is OFF, LV diode 330 may exhibit a leakage current causing normally ON III-nitride power transistor 330 to supply a comparable, supporting leakage current. This can cause instability in composite semiconductor device 300, and can potentially rupture the gate dielectric used to insulate gate 316 of III-nitride power transistor 310. To mitigate such an effect, in some implementations, composite semiconductor device 300 may further incorporate a current source, including perhaps a second normally ON III-nitride device, as disclosed in U.S. Provisional Application No. 61/454,081, entitled "Improved High Voltage Rectifier and Switching Circuits," filed on Mar. 18, 2011, which is hereby incorporated by reference in its entirety.

The size of LV diode 330 may also be advantageously optimized for forward operation, e.g., wherein current flows through the diode in forward mode. The diode size cannot be so small that it develops a large voltage, since this large voltage will pull drain 344 of LV transistor 340 down with respect to gate 316 of III-nitride power transistor 310, which can impair the reliability of composite semiconductor device 300. Thus, LV diode 330 should be sized such that forward transient current flows can be accommodated while developing only a small voltage across LV diode 330.

As further taught by Applicants herein, in some implementations, voltage protection for LV transistor 340 and LV diode 330 can be provided through optimization of the output capacitances of III-nitride power transistor 310 and LV device 320, e.g., respective output capacitances 318 and 348. For example, the ratio of output capacitance 318 to output capacitance 348 may be set based on a ratio of the drain voltage of III-nitride power transistor 310 to the breakdown voltage of LV device 320 so as to provide voltage protection for LV device 320.

As an example, for alternating-current (AC) operating conditions, the output capacitance 318 of III-nitride power transistor 310 (e.g., C1) and the output capacitance 348 of LV device 320 (e.g., C2), can be described by the following set of equations:

$$\text{Charge Ratio} = \frac{Q_{oss\_GaN}}{Q_{oss\_Si}} \qquad \text{Equation 1}$$

Moreover, during transient operation, the voltage at drain 344 of LV transistor 340 is set by the ratio of output capacitances 318 and 348 according to:

$$V_{LV\_drain} = V_{Composite\_drain} * C2/(C1+C2) \qquad \text{Equation 2}$$

Utilizing the example values described above for the composite drain voltage (e.g., 600V) and the breakdown voltage of LV device 320 (e.g., 25V) yields Result 1:

$$(C1+C2)/C2 \sim 24, \text{ or, equivalently, } C1/C2 \sim 23 \qquad \text{Result 1}$$

Based on Result 1, output capacitances 318 and 348 may be designed to satisfy this ratio in order to provide voltage protection for LV device 320. In other implementations, the composite drain voltage may range from approximately 100V to approximately 1200V, for example, while the breakdown voltage of LV device 320 may fall in a range from approximately 10V to approximately 50 volts. Thus, according to Result 1 above, the ratio of C1 to C2 may be expected to be less than approximately 120 (i.e., C1/C2 may range from approximately 1 to approximately 119 consistent with the breakdown voltage range for LV device 320 and the composite drain voltage range described above).

Figure 4A:
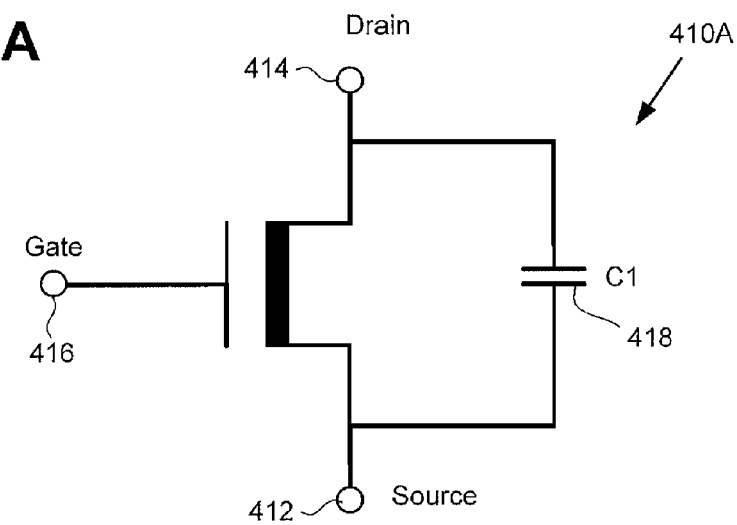
FIG. 4A depicts an exemplary output capacitance of a III-nitride power transistor.
Figure 4B:
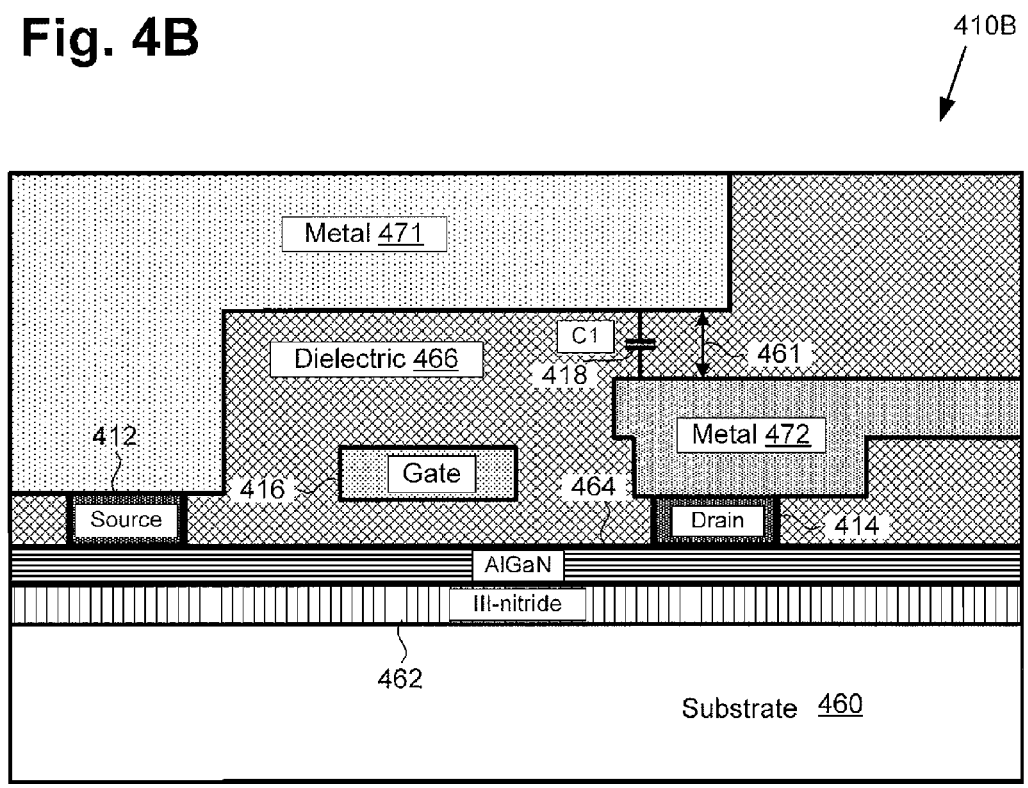
FIG. 4B shows a cross-sectional representation of a structure corresponding to the III-nitride power transistor depicted in FIG. 4A.

Referring to FIGS. 4A and 4B, FIG. 4A depicts an exemplary output capacitance of III-nitride power transistor 410A, while FIG. 4B, displays a cross-sectional representation of structure 410B corresponding to III-nitride power transistor 410A, in FIG. 4A. As shown in FIGS. 4A and 4B, III-nitride power transistor 410A/410B includes source 412, drain 414, and gate 416, and produces output capacitance 418 corresponding respectively to source 312, drain 314, gate 316, and output capacitance 318, in FIG. 3. In addition, FIG. 4B shows substrate 460, an exemplary heterostructure including III-nitride layer 462 and AlGaN layer 464, dielectric 466, source metal 471, drain metal 472, and distance 461 separating drain metal 472 from overlying source metal 471. As may be apparent from FIG. 4B, output capacitance 418 (C1) can be altered according to the device layout. More specifically, the overlap between source metal 471 and drain metal 472 can be designed and formed carefully in combination with the properties of dielectric 466 to target a specific value for C1.

It is noted that when setting the ratio of C1 and C2, as described by reference to FIG. 3, it is typically impracticable to increase the output capacitance 348 (C2) of LV device 320 beyond certain limits. For example, excessive output charge in LV device 320 may reduce the performance improvements associated with a low reverse recovery charge (Qrr) of composite semiconductor device 300.

Continuing with reference to FIG. 3, it may also be found advantageous to minimize inductance 307, either through optimization of the layout of III-nitride transistor 310 or through reduction in semiconductor package parasitics. In one implementation, for example, III-nitride power transistor 310 and LV device 320 may be monolithically integrated, as disclosed in U.S. patent application Ser. No. 12/455,117, entitled "Monolithic Vertically Integrated Composite Group III-V and Group IV Semiconductor Device and Method for Fabricating Same", filed on May 28, 2009 and issued as U.S. Pat. No. 7,915,645 on Mar. 29, 2011; as well as by U.S. patent application Ser. No. 12/653,240, entitled "Highly Conductive Source/Drain Contacts in III-Nitride Transistors", filed on Dec. 10, 2009; U.S. patent application Ser. No. 12/928,103, entitled "Monolithic Integration of Silicon and Group III-V Devices", filed on Dec. 3, 2010; and U.S. patent application Ser. No. 13/020,243 entitled "Efficient High Voltage Switching Circuits and Monolithic Integration of Same", filed on Feb. 3, 2011, each of which is hereby incorporated by reference in its entirety.

Thus, the composite semiconductor devices disclosed herein enable implementation of HV power devices including voltage protected. LV devices. As a result, an LV group IV device can be advantageously cascoded with a normally ON III-nitride power transistor to produce a rugged normally OFF HV composite device displaying high durability and enhanced resistance to voltage breakdown.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A normally OFF composite semiconductor device, comprising:
    a normally ON III-nitride power transistor having a first output capacitance;
    a low voltage (LV) device cascoded with said normally ON III-nitride power transistor to form said normally OFF composite semiconductor device, said LV device having a second output capacitance;
    said first output capacitance and said second output capacitance being designed to satisfy a first ratio set according to a second ratio of a drain voltage of said normally ON III-nitride power transistor to a breakdown voltage of said LV device so as to provide voltage protection for said LV device;
    said normally ON III-nitride power transistor configured to turn OFF in response to a voltage across said LV device,
    wherein said first ratio is set to less than 120.

2. The normally OFF composite semiconductor device of claim 1, wherein said normally ON III-nitride power transistor is one of a III-nitride field-effect transistor (III-N FET) and a III-nitride high electron mobility transistor (III-N HEMT).

3. The normally OFF composite semiconductor device of claim 1, wherein said LV device comprises an LV group IV semiconductor device.

4. The normally OFF composite semiconductor device of claim 1, wherein said LV device comprises an LV silicon device.

5. The normally OFF composite semiconductor device of claim 1, wherein said LV device comprises an LV field-effect transistor (LV FET).

6. The normally OFF composite semiconductor device of claim 1, wherein said LV device is one of an LV metal-oxide-semiconductor FET (LV MOSFET) and an LV metal-insulator-semiconductor FET (LV MISFET).

7. The normally OFF composite semiconductor device of claim 1, wherein said LV device comprises an LV diode.

8. The normally OFF composite semiconductor device of claim 1, wherein said normally ON III-nitride power transistor and said LV device are monolithically integrated.

9. A normally OFF composite semiconductor device, comprising: a normally ON III-nitride power transistor having a first output capacitance; a low voltage (LV) device cascoded with said normally ON III-nitride power transistor to form said normally OFF composite semiconductor device, said LV device having a drain and a second output capacitance, wherein a ratio of said first output capacitance to said second output capacitance is based on a drain voltage of said normally ON III-nitride power transistor and a breakdown voltage of said LV device, and set to ensure that a voltage at said drain of the LV device does not rise beyond said breakdown voltage of said LV device, wherein said normally ON III-nitride power transistor is configured to, and turn OFF in response to a voltage across said LV device, and wherein said ratio is set to less than 120.

10. The normally OFF composite semiconductor device of claim 9, wherein said normally ON III-nitride power transistor is one of a III-nitride field-effect transistor (III-N FET) and a III-nitride high electron mobility transistor (III-N HEMT).

11. The normally OFF composite semiconductor device of claim 9, wherein said LV device comprises an LV group IV semiconductor device.

12. The normally OFF composite semiconductor device of claim 9, wherein said LV device comprises an LV silicon device.

13. The normally OFF composite semiconductor device of claim 9, wherein said LV device comprises an LV field-effect transistor (LV FET).

14. The normally OFF composite semiconductor device of claim 9, wherein said LV device is one of an LV metal-oxide-semiconductor FET (LV MOSFET) and an LV metal-insulator-semiconductor FET (LV MISFET).

15. The normally OFF composite semiconductor device of claim 9, wherein said LV device comprises an LV diode.

16. The normally OFF composite semiconductor device of claim 9, wherein said normally ON III-nitride power transistor and said LV device are monolithically integrated.

* * * * *